United States Patent
Manahan et al.

(10) Patent No.: US 9,668,385 B2
(45) Date of Patent: May 30, 2017

(54) CONTROLLING AIRFLOW WITHIN AN EXPLOSION-PROOF ENCLOSURE

(75) Inventors: Joseph Michael Manahan, Manlius, NY (US); Graig E. DeCarr, Cicero, NY (US)

(73) Assignee: Cooper Technologies Company, Houston, TX (US)

( * ) Notice: Subject to any disclaimer, the term of this patent is extended or adjusted under 35 U.S.C. 154(b) by 1502 days.

(21) Appl. No.: 13/331,331

(22) Filed: Dec. 20, 2011

(65) Prior Publication Data

US 2012/0161596 A1 Jun. 28, 2012

Related U.S. Application Data

(60) Provisional application No. 61/426,422, filed on Dec. 22, 2010.

(51) Int. Cl.
| | |
|---|---|
| *H02K 5/136* | (2006.01) |
| *H05K 7/20* | (2006.01) |
| *H02B 1/28* | (2006.01) |
| *H02B 1/56* | (2006.01) |

(52) U.S. Cl.
CPC ........... *H05K 7/20909* (2013.01); *H02B 1/28* (2013.01); *H02B 1/56* (2013.01)

(58) Field of Classification Search
CPC . H02K 5/136; B23Q 5/58; H02B 1/28; H02B 1/56; H05K 7/20909
USPC .......................................................... 454/184
IPC ...................................................... H02K 5/136
See application file for complete search history.

(56) References Cited

U.S. PATENT DOCUMENTS

| | | | |
|---|---|---|---|
| 2,801,768 A | * | 8/1957 | Immel ........................... 220/88.2 |
| 2,917,384 A | | 12/1959 | Grandey |
| 4,158,875 A | | 6/1979 | Tajima et al. |
| 4,328,901 A | * | 5/1982 | Gunderman et al. ........ 220/88.2 |
| 4,909,315 A | | 3/1990 | Nelson et al. |
| 5,237,484 A | | 8/1993 | Ferchau et al. |
| 5,395,042 A | | 3/1995 | Riley et al. |

(Continued)

FOREIGN PATENT DOCUMENTS

| | | |
|---|---|---|
| CN | 1756012 | 4/2006 |
| CN | 202339514 | 7/2012 |

(Continued)

OTHER PUBLICATIONS

English Machine Translation of EP 1729202.

(Continued)

*Primary Examiner* — Steven B McAllister
*Assistant Examiner* — Samantha Miller
(74) *Attorney, Agent, or Firm* — King & Spalding LLP

(57) ABSTRACT

A system is described herein. The system can include an explosion-proof enclosure having an interior comprising a first region and a second region. The system can also include a heat-generating component positioned within the second region of the explosion-proof enclosure. The system can further include an air moving device positioned within the first region of the explosion-proof enclosure. The air moving device can draw a first portion of intake air from outside the explosion-proof enclosure. The air moving device can also pass the first portion of the intake air over the heat-generating component to generate first exhaust air, where the first portion of the intake air cools the heat-generating component. The air moving device can further remove the first exhaust air from the interior of the explosion-proof enclosure.

19 Claims, 5 Drawing Sheets

(56) References Cited

U.S. PATENT DOCUMENTS

| | | | |
|---|---|---|---|
| 5,657,641 A | 8/1997 | Cunningham et al. | |
| 5,696,500 A | 12/1997 | Diem | |
| 5,914,858 A | 6/1999 | McKeen et al. | |
| 6,294,721 B1* | 9/2001 | Oravetz et al. | 136/242 |
| 6,369,319 B1 | 4/2002 | Nagashima et al. | |
| 6,392,322 B1* | 5/2002 | Mares et al. | 310/88 |
| 6,525,936 B2 | 2/2003 | Beitelmal et al. | |
| 6,533,031 B1* | 3/2003 | Garcia et al. | 165/263 |
| 6,574,105 B2 | 6/2003 | Nakano et al. | |
| 6,657,863 B2 | 12/2003 | Lee et al. | |
| 6,708,834 B2 | 3/2004 | Hagerman, III | |
| 6,776,706 B2 | 8/2004 | Kipka et al. | |
| 6,900,387 B2 | 5/2005 | Gravell et al. | |
| 6,900,565 B2 | 5/2005 | Preston | |
| 6,953,491 B2 | 10/2005 | Goyetche | |
| 7,016,193 B1 | 3/2006 | Jacques et al. | |
| 7,310,228 B2* | 12/2007 | Chen | 361/695 |
| 7,361,081 B2 | 4/2008 | Beitelmal et al. | |
| 7,397,665 B2 | 7/2008 | Yuval | |
| 7,505,269 B1* | 3/2009 | Cosley et al. | 361/700 |
| 7,508,664 B2 | 3/2009 | Holland | |
| 7,611,402 B2 | 11/2009 | McClellan et al. | |
| 7,752,858 B2 | 7/2010 | Johnson et al. | |
| 7,755,889 B2 | 7/2010 | Vinson et al. | |
| 2006/0202045 A1 | 9/2006 | Liu | |
| 2007/0056307 A1 | 3/2007 | Caggiano | |
| 2007/0095554 A1 | 5/2007 | Noda | |
| 2007/0231677 A1 | 10/2007 | Stocchiero | |
| 2007/0259616 A1 | 11/2007 | Scattolin et al. | |
| 2007/0285889 A1 | 12/2007 | Watson et al. | |
| 2008/0060371 A1* | 3/2008 | Jude | 62/259.2 |
| 2008/0101016 A1 | 5/2008 | Brooks et al. | |
| 2008/0137296 A1* | 6/2008 | DuQuette et al. | 361/695 |
| 2008/0256693 A1 | 10/2008 | Mickleson et al. | |
| 2009/0097202 A1 | 4/2009 | Gipson | |
| 2009/0253360 A1 | 10/2009 | Tafoya | |
| 2009/0318071 A1 | 12/2009 | Nemoz et al. | |
| 2010/0284150 A1 | 11/2010 | Manahan et al. | |
| 2010/0288467 A1 | 11/2010 | Manahan et al. | |
| 2010/0311316 A1 | 12/2010 | Tindale et al. | |
| 2010/0317279 A1 | 12/2010 | Yatskov | |
| 2011/0120067 A1 | 5/2011 | Kim | |
| 2011/0141684 A1* | 6/2011 | Klarer | 361/679.33 |
| 2011/0197767 A1 | 8/2011 | Seitz | |

FOREIGN PATENT DOCUMENTS

| | | |
|---|---|---|
| EP | 1729202 | 12/2006 |
| JP | 2006243635 | 9/2006 |
| RU | 32301 | 9/2003 |
| RU | 89200 | 11/2009 |
| RU | 110518 | 11/2011 |
| RU | 111901 | 12/2011 |
| WO | 2004038173 | 5/2007 |

OTHER PUBLICATIONS

Crouse-Hinds by Eaton, Article 500-516 of the National Electrical Code with Product Recommendations for Use in Hazardous (Classified) Areas, Eaton's Crouse-Hinds 2014 Code Digest, Jan. 2014, pp. 1-128, Eaton Corporation, Cleveland, Ohio.

Nema, Nema Enclosure Types, Nov. 2005, 9 pages, National Electrical Manufacturers Association.

Machine translation of CN1756012A, via Lexisnexis Total Patent, 5 pages.

Machine translation of CN202339514U, via Lexisnexis Total Patent, 5 pages.

The State Intellectual Property Office of China, Office Action issued in Chinese Patent Application No. 201380055889.7, issued Mar. 28, 2016, 12 pages.

Translation of Office Action issued in Chinese Patent Application No. 201380055889.7, issued Mar. 28, 2016, 18 pages.

* cited by examiner

CONTROLLING AIRFLOW WITHIN AN EXPLOSION-PROOF ENCLOSURE

CROSS-REFERENCE TO RELATED APPLICATIONS

This application claims priority under 35 U.S.C. §119 to U.S. Provisional Patent Application Ser. No. 61/426,422, titled "Controlled Airflow Within An Explosion-Proof Enclosure" and filed on Dec. 22, 2010, the entire contents of which are hereby incorporated herein by reference.

The present application also is related to the following concurrently filed application: "Manifold For Controlling Airflow Within an Explosion-Proof Enclosure" in the names of Joseph Michael Manahan and Graig E. DeCarr, the entire contents of which are hereby incorporated herein by reference.

TECHNICAL FIELD

The present disclosure relates generally to controlling airflow within an explosion-proof enclosure, and more particularly to systems, methods, and devices for controlling airflow to reduce temperature within an explosion-proof enclosure that includes heat-producing equipment.

BACKGROUND

Explosion-proof receptacle housings and enclosure systems are used in many different industrial applications. Such explosion-proof receptacle housing and enclosure systems may be used, for example, in military applications, onboard ships, assembly plants, power plants, oil refineries, petrochemical plants, and other harsh environments. At times, the equipment located inside such explosion-proof receptacle housing and enclosure systems are used to control motors and other industrial equipment.

Traditional motor starters and related equipment fail to provide adequate torque control and result in excessive wear on the motor and associated equipment. Instead, variable frequency drives (VFDs) are often used in place of traditional motor starters. However, VFDs tend to generate heat and are subject to failure when exposed to excessive temperatures caused by the heat loss. A common practice to reduce heat-related problems is to remove the VFD to a remote location so that an explosion-proof receptacle housing and enclosure system is not required, allowing proper cooling of the VFD during operation. However, installation costs may increase and operational problems may result from increased line losses from the added distance that signals between the VFD and the related equipment must travel.

SUMMARY

In general, in one aspect, the disclosure relates to a system. The system can include an explosion-proof enclosure having an interior comprising a first region and a second region. The system can also include a heat-generating component positioned within the second region of the explosion-proof enclosure. The system can further include an air moving device positioned within the first region of the explosion-proof enclosure. The air moving device can draw a first portion of intake air from outside the explosion-proof enclosure. The air moving device can also pass the first portion of the intake air over the heat-generating component to generate first exhaust air, where the first portion of the intake air cools the heat-generating component. The air moving device can further remove the first exhaust air from the interior of the explosion-proof enclosure.

In another aspect, the disclosure can generally relate to a method for controlling air flowing through an explosion-proof enclosure heated by a heat-generating component. The method can include drawing, based on input received from a measuring device, intake air from outside the explosion-proof enclosure to an interior of the explosion-proof enclosure, where the interior comprises a first region and a second region. The method can also include passing a first portion of the intake air over the heat-generating component positioned within the second region of the explosion-proof enclosure to generate first exhaust air, where the first portion of the intake air cools the heat-generating component. The method can further include passing the first exhaust air from the second region to the first region of the explosion-proof enclosure. The method can also include removing the first exhaust air from the interior of the explosion-proof enclosure to the outside of the explosion-proof enclosure, where the first exhaust air has a first temperature greater than a second temperature of the intake air.

In another aspect, the disclosure can generally relate to a computer readable medium that includes computer readable program code embodied therein for performing a method for controlling air flowing through an explosion-proof enclosure heated by a heat-generating component. The method performed by the computer readable program code of the computer readable medium can include drawing, based on input from a measuring device, intake air from outside the explosion-proof enclosure to an interior of the explosion-proof enclosure, where the interior comprises a first region and a second region. The method performed by the computer readable program code of the computer readable medium can further include passing a first portion of the intake air over the heat-generating component positioned within the second region of the explosion-proof enclosure to generate first exhaust air, where the first portion of the intake air cools the heat-generating component. The method performed by the computer readable program code of the computer readable medium can also include passing the first exhaust air from the second region to the first region of the explosion-proof enclosure. The method performed by the computer readable program code of the computer readable medium can further include removing the first exhaust air from the interior of the explosion-proof enclosure to the outside of the explosion-proof enclosure, where the first exhaust air has a first temperature greater than a second temperature of the intake air.

These and other aspects, objects, features, and embodiments of the present invention will be apparent from the following description and the appended claims.

BRIEF DESCRIPTION OF THE DRAWINGS

The drawings illustrate only exemplary embodiments of controlling airflow within an explosion-proof enclosure and are therefore not to be considered limiting of its scope, as the disclosure may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles. In the drawings, reference numerals designate like or corresponding, but not necessarily identical, elements.

DETAILED DESCRIPTION

Figure 1:
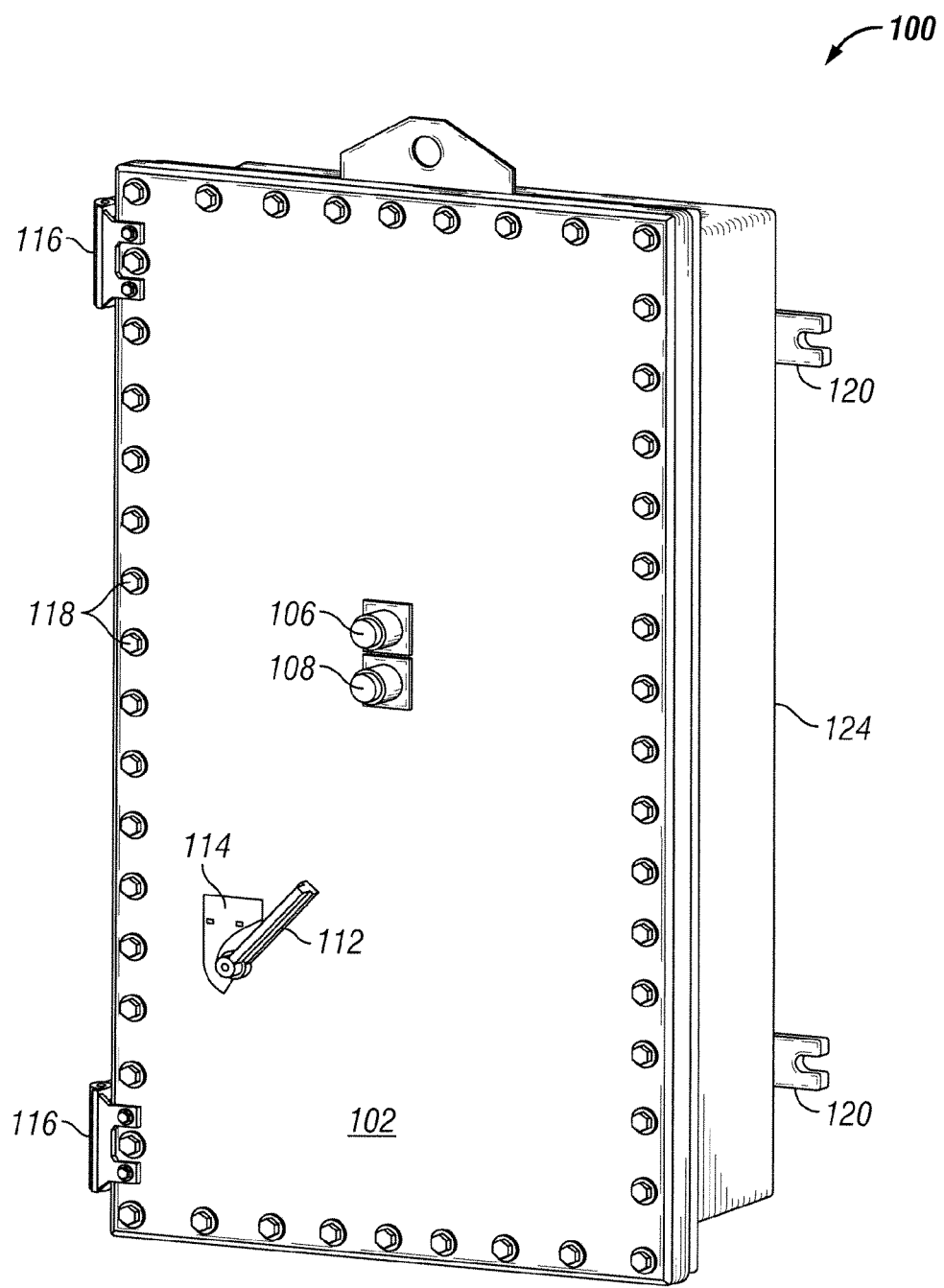
FIGS. 1 and 2 show explosion-proof enclosures in which one or more exemplary embodiments of controlling airflow may be implemented.

Exemplary embodiments of controlling airflow within an explosion-proof enclosure will now be described in detail with reference to the accompanying figures. Like elements in the various figures are denoted by like reference numerals for consistency.

In the following detailed description of exemplary embodiments of controlling airflow within an explosion-proof enclosure, numerous specific details are set forth in order to provide a more thorough understanding of controlling airflow within an explosion-proof enclosure. However, it will be apparent to one of ordinary skill in the art that controlling airflow within an explosion-proof enclosure may be practiced without these specific details. In other instances, well-known features have not been described in detail to avoid unnecessarily complicating the description. Further, certain descriptions (e.g., top, bottom, side, end, interior, inside) are merely intended to help clarify aspects of controlling airflow within an explosion-proof enclosure and are not meant to limit embodiments of controlling airflow within an explosion-proof enclosure.

In general, exemplary embodiments of controlling airflow within an explosion-proof enclosure provide systems, methods, and devices for using an air moving device to pass air through the explosion-proof enclosure to cool heat-generating components. Specifically, exemplary embodiments of controlling airflow within an explosion-proof enclosure provide for using an air moving device to draw intake air from outside the explosion-proof enclosure to an interior of the explosion-proof enclosure, pass the intake air over the heat-generating components to cool the heat-generating components, and remove the heated intake air (i.e., exhaust air) from the explosion-proof enclosure.

While the exemplary embodiments discussed herein are with reference to explosion-proof enclosures, other types of non-explosion-proof enclosures (e.g., junction boxes, control panels, lighting panels, motor control centers, switchgear cabinets, relay cabinets) or any other type of enclosure may be used in conjunction with exemplary embodiments of controlling airflow.

A user may be any person that interacts with the explosion-proof enclosure or equipment controlled by one or more components of the explosion-proof enclosure. Specifically, a user may program, operate, and/or interface with one or more components (e.g., an air moving device controller, a VFD) associated with controlling airflow within an explosion-proof enclosure. Examples of a user may include, but are not limited to, an engineer, an electrician, an instrumentation and controls technician, a mechanic, an operator, a consultant, a contractor, and a manufacturer's representative.

In one or more exemplary embodiments, the heat-generating components inside the explosion-proof enclosure are any components that produce heat energy during operation. A component may include, but is not limited to, one or more of a device (e.g., VFD, sensor, control panel, circuit board, relay), a terminal, cable, wiring, a switch, a handle, an indicating light, a duct, and conduit.

In one or more exemplary embodiments, an explosion-proof enclosure (also known as a flame-proof enclosure) is an enclosure that is configured to contain an explosion that originates inside the enclosure. Further, the explosion-proof enclosure is configured to allow gases from inside the enclosure to escape across joints of the enclosure and cool as the gases exit the explosion-proof enclosure. The joints are also known as flame paths and exist where two surfaces meet and provide a path, from inside the explosion-proof enclosure to outside the explosion-proof enclosure, along which one or more gases may travel. A joint may be a mating of any two or more surfaces. Each surface may be any type of surface, including but not limited to a flat surface, a threaded surface, and a serrated surface.

In one or more exemplary embodiments, an explosion-proof enclosure is subject to meeting certain standards and/or requirements. For example, the NEMA sets standards by which an enclosure must comply in order to qualify as an explosion-proof enclosure. Specifically, NEMA Type 7, Type 8, Type 9, and Type 10 enclosures set standards by which an explosion-proof enclosure within a hazardous location must comply. For example, a NEMA Type 7 standard applies to enclosures constructed for indoor use in certain hazardous locations. Hazardous locations may be defined by one or more of a number of authorities, including but not limited to the National Electric Code (e.g., Class 1, Division I) and Underwriters' Laboratories, Inc. (UL) (e.g., UL 698). For example, a Class 1 hazardous area under the National Electric Code is an area in which flammable gases or vapors may be present in the air in sufficient quantities to be explosive.

As a specific example, NEMA standards for an explosion-proof enclosure of a certain size or range of sizes may require that in a Group B, Division 1 area, any flame path of an explosion-proof enclosure must be at least 1 inch long (continuous and without interruption), and the gap between the surfaces cannot exceed 0.0015 inches. Standards created and maintained by NEMA may be found at www.nema.org/stds and are hereby incorporated by reference.

Figure 2:
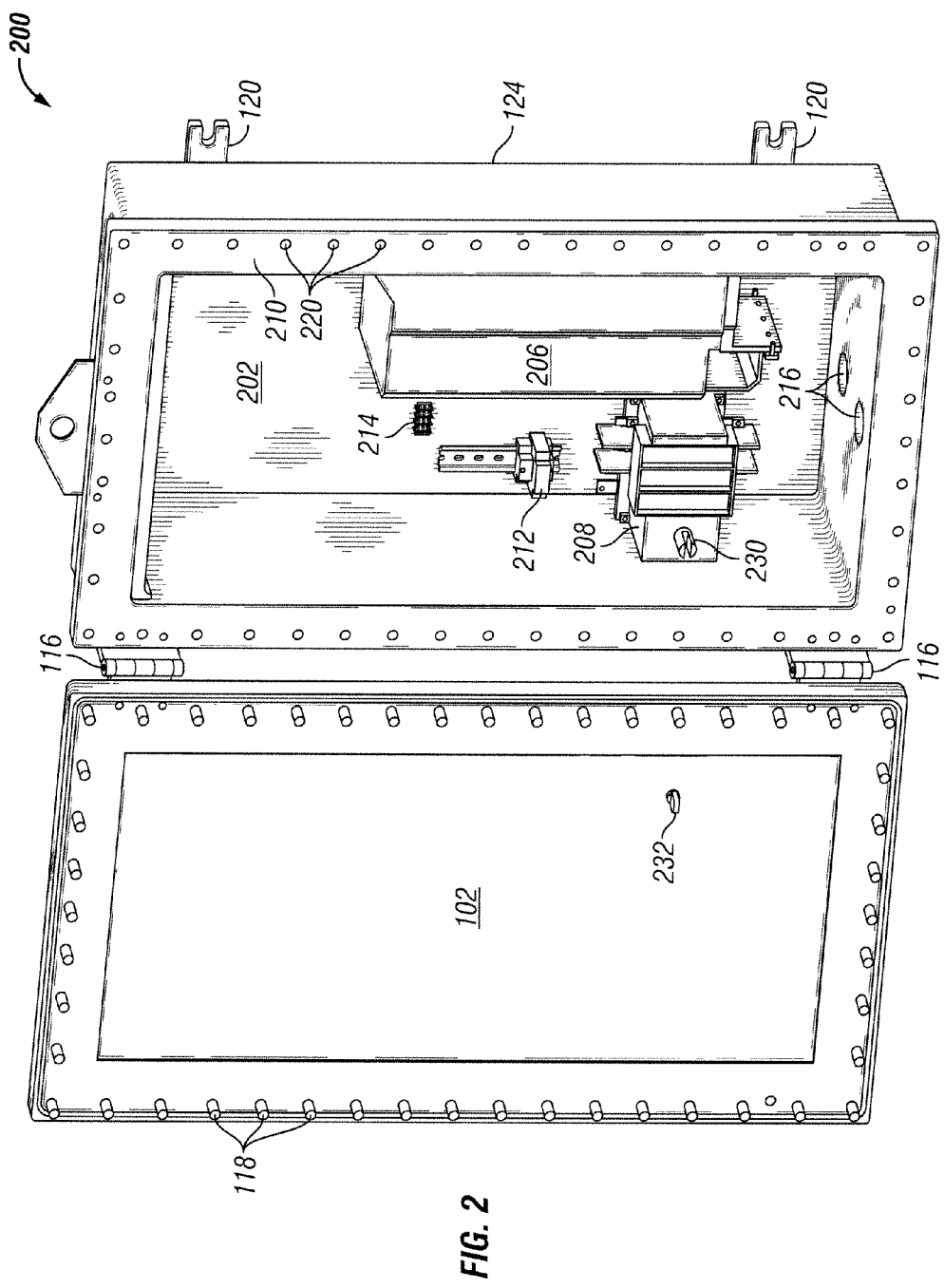

FIGS. 1 and 2 depict an explosion-proof enclosure 100 in which one or more exemplary embodiments of controlling airflow within an explosion-proof enclosure may be implemented. In one or more exemplary embodiments, one or more of the components shown in FIGS. 1 and 2 may be omitted, repeated, and/or substituted. Accordingly, exemplary embodiments of an explosion-proof enclosure should not be considered limited to the specific arrangements of components shown in FIGS. 1 and 2.

Referring now to FIG. 1, an example of an explosion-proof enclosure 100 in a closed position is shown. The enclosure cover 102 is secured to the enclosure body 124 by a number of fastening devices 118 located at a number of points around the perimeter of the enclosure cover 102. In one or more exemplary embodiments, a fastening device 118 may be one or more of a number of fastening devices, including but not limited to a bolt (which may be coupled with a nut), a screw (which may be coupled with a nut), and a clamp. In addition, one or more hinges 116 are secured to one side of the enclosure cover 102 and a corresponding side of the enclosure body 124 so that, when all of the fastening devices 118 are removed, the enclosure cover 102 may swing outward (i.e., an open position) from the enclosure body 124 using the one or more hinges 116. In one or more exemplary embodiments, there are no hinges, and the enclosure cover 102 is separated from the enclosure body 124 when all of the fastening devices 118 are removed.

The enclosure cover 102 and the enclosure body 124 may be made of any suitable material, including metal (e.g., alloy, stainless steel), plastic, some other material, or any combination thereof. The enclosure cover 102 and the enclosure body 124 may be made of the same material or different materials.

In one or more exemplary embodiments, on the end of the enclosure body 124 opposite the enclosure cover 102, one or more mounting brackets 120 are affixed to the exterior of the enclosure body 124 to facilitate mounting the enclosure 100. Using the mounting brackets 120, the enclosure 100 may be mounted to one or more of a number of surfaces and/or elements, including but not limited to a wall, a control cabinet, a cement block, an I-beam, and a U-bracket.

The enclosure cover 102 may include one or more features that allow for user interaction while the enclosure 100 is sealed in the closed position. As shown in FIG. 1, one or more indicating lights (e.g., indicating light 1 106, indicting light 2 108) may be located on the enclosure cover 102. Each indicating light may be used to indicate a status of a feature or process associated with equipment inside the enclosure 100. For example, an indicating light may show a constant green light if a motor controlled by a VFD inside the enclosure 100 is operating. As another example, an indicating light may flash red when a motor controlled by a VFD inside the enclosure 100 has a problem (e.g., tripped circuit, VFD overheats, overcurrent situation). As another example, an indicating light may show a constant red light when an electromagnetic pulse caused by an explosion inside the enclosure 100 has resulted. An indicating light may be made of one or more materials (e.g., glass, plastic) using one or more different lighting sources (e.g., light-emitting diode (LED), incandescent bulb).

In one or more exemplary embodiments, the enclosure cover 102 may also include a switch handle 112 that allows a user to operate a switch (not shown) located inside the explosion-proof enclosure 100 while the explosion-proof enclosure 110 is closed. Those skilled in the art will appreciate that the switch handle 112 may be used for any type of switch. Each position (e.g., OFF, ON, HOLD, RESET) of the switch may be indicated by a switch position indicator 114 positioned adjacent to the switch handle 112 on the outer surface of the enclosure cover 102. A switch associated with the switch handle 112 and the switch position indicator 114 may be used to electrically and/or mechanically isolate, and/or change the mode of operation of, one or more components inside or associated with the explosion-proof enclosure 100. For example, the switch handle 112 may point to "OFF" on the switch position indicator 114 when a disconnect switch located inside the explosion-proof enclosure 100 is disengaged. In such a case, all equipment located inside the explosion-proof enclosure 100, as well as the equipment (e.g., a motor) controlled by the equipment located inside the explosion-proof enclosure 100, may be without power.

Referring now to FIG. 2, an example of an explosion-proof enclosure 100 in an open position in accordance with one or more exemplary embodiments is shown. The explosion-proof enclosure 100 is in the open position because the enclosure cover (not shown) is not secured to the enclosure body 124. The hinges 116 attached to the left side of the enclosure body 124 are also attached to the left side of the enclosure cover, which is swung outward from the enclosure body 124. Because the explosion-proof enclosure 100 is in the open position, the components of the explosion-proof enclosure 100 are visible to a user.

As described above with respect to FIG. 1, the enclosure body 124 includes two or more mounting brackets 120. In addition, in one or more exemplary embodiments, the enclosure body 124 includes an enclosure engagement surface 210, against which the enclosure cover meets when the explosion-proof enclosure 100 is in the closed position. A number of fastening device apertures 220 are shown around the enclosure engagement surface 210, where each of the fastening device apertures 220 are configured to receive a fastening device 118 that traverses through the enclosure cover 102, as described above with respect to FIG. 1. The number of fastening device apertures 220 may vary, depending on one or more of a number of factors, including but not limited to the size of the fastening device apertures 220, a standard that the explosion-proof enclosure 100 meets, and the type of fastening device 118 used. The number of fastening device apertures 220 may be zero.

In one or more exemplary embodiments, the explosion-proof enclosure 100 of FIG. 2 includes a mounting plate 202 that is affixed to the back of the inside of the explosion-proof enclosure 100. The mounting plate 202 may be configured to receive one or more components such that the one or more components are affixed to the mounting plate 202. The mounting plate 202 may include one or more apertures configured to receive securing devices that may be used to affix a component to the mounting plate 202. The mounting plate 202 may be made of any suitable material, including but not limited to the material of the enclosure body 124. In one or more exemplary embodiments, some or all of the one or more components may be mounted directly to an inside wall of the explosion-proof enclosure 100 rather than to the mounting plate 202.

In one or more exemplary embodiments, a VFD 206 is affixed to the mounting plate 202 inside the explosion-proof enclosure 100. The VFD 206 may include any components used to drive a motor and/or other device using variable control signals for controlled starts, stops, and/or operations of the motor and/or other devices. Examples of components of a VFD include, but are not limited to, discrete relays, a programmable logic controller (PLC), a programmable logic relay (PLR), an uninterruptible power supply (UPS), and a distributed control system (DCS). In one or more exemplary embodiments, one or more components of the VFD may replace the VFD. For example, the VFD may be substituted by one or more PLCs, one or more PLRs, one or more UPSs, one or more DCSs, and/or other heat-generating components.

In one or more exemplary embodiments, a switch 208 is affixed to the mounting plate 202 inside the explosion-proof enclosure 100. The switch 208 may be configured to electrically and/or mechanically isolate, and/or change the mode of operation of, one or more components located inside the explosion-proof enclosure 100 and/or one or more components located outside the explosion-proof enclosure 100. The switch 208 may be any type of switch, including but not limited to a disconnect switch, a test switch, a reset switch, an indicator switch, and a relay switch. For example, the switch 208 may be a disconnect switch that is used to cut off power to all components in the explosion-proof enclosure 100 and all devices located outside the explosion-proof enclosure 100 that are controlled by the components inside the explosion-proof enclosure 100. As another example, the switch 208 may be a bypass switch that is used to deactivate a protection scheme (e.g., a relay) or some other particular component or group of components located inside the explosion-proof enclosure 100.

The switch 208 may further be configured to receive, through mechanical and/or electrical means, a directive to change states (e.g., open, closed, hold) from a component located on the enclosure cover. For example, if the enclosure cover includes a switch handle (as described above with respect to FIG. 1), then a switch handle shaft 232 may extend from the switch handle through the enclosure cover to a switch coupling 230 of the switch 208. When the explosion-proof enclosure 100 is in the closed position, the switch handle shaft 232 couples with the switch coupling 230, and switch 208 may be operated by operating the switch handle located outside the explosion-proof enclosure, as described above with respect to FIG. 1.

In one or more exemplary embodiments, one or more relays (e.g., relay 212) are affixed to the mounting plate 202 inside the explosion-proof enclosure 100. A relay 212 may be configured to control one or more operations of one or more components located in, or associated with, the explosion-proof enclosure 100. Specifically, a relay 212 may, through one or more relay contacts, allow electrical current to flow and/or stop electrical current from flowing to one or more components in the enclosure 100 based on whether a coil of the relay 212 is energized or not. For example, if the coil of the relay 212 is energized, then a contact on the relay may be closed to allow current to flow to energize a motor. The relay 212 may be activated based on a timer, a current, a voltage, some other suitable activation method, or any combination thereof. The relay 212 may also be configured to emit a signal when a condition has occurred. For example, the relay 212 may flash a red light to indicate that the VFD 206 is in an alarm state.

In one or more exemplary embodiments, wiring terminals 214 are affixed to the mounting plate 202 inside the explosion-proof enclosure 100. Wiring terminals 214 are a series of terminals where one terminal is electrically connected to at least one other terminal in the series of terminals while remaining electrically isolated from the remaining terminals in the series of terminals. In other words, two or more terminals among the series of terminals act as a junction point where multiple wires may be electrically connected through the joined terminals.

In one or more exemplary embodiments, one or more entry holes 216 may extend through one or more sides (e.g., bottom) of the enclosure body 124. Each entry hole 216 may be configured to allow cables and/or wiring for power, control, and/or communications to pass through from outside the explosion-proof enclosure 100 to one or more components inside the explosion-proof enclosure 100. An entry hole 216 may be joined with a conduit and coupling from outside the explosion-proof enclosure 100 to protect the cables and/or wiring received by the entry hold 216 and to help maintain the integrity of the explosion-proof enclosure 100 through the entry hole 216.

Figure 3:
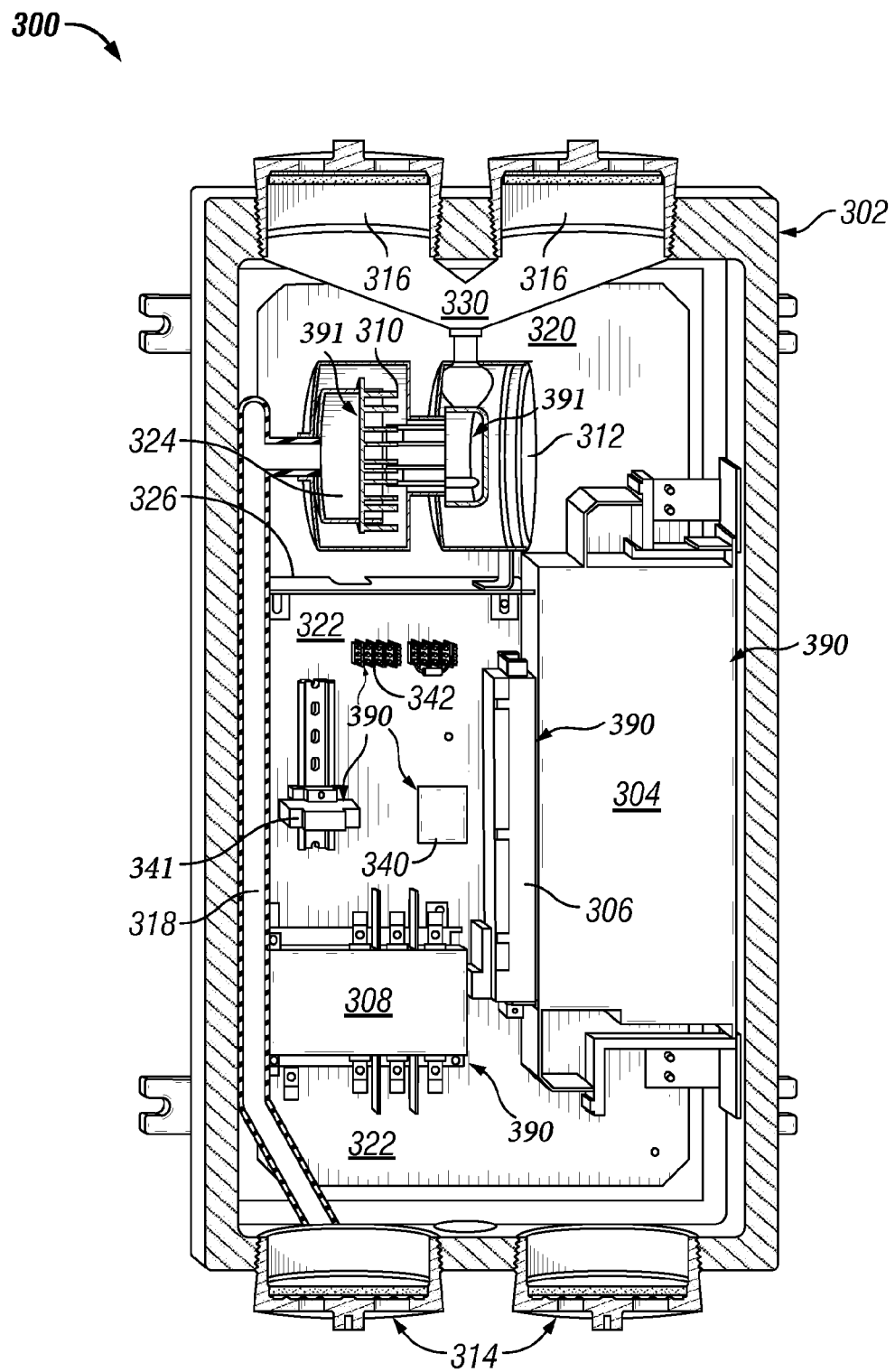
FIG. 3 shows a system for controlling airflow within an explosion-proof enclosure in accordance with one or more exemplary embodiments.

FIG. 3 shows an example system 300 of an explosion-proof enclosure in which airflow is controlled in accordance with one or more exemplary embodiments. Features shown but not described and/or labeled in FIG. 3 are described and/or labeled above with respect to FIG. 2. Exemplary embodiments of controlling airflow inside an explosion-proof enclosure are not limited to the configuration shown in FIG. 3 and discussed herein.

FIG. 3 shows a system 300 from the perspective of a frontal view of an interior of an explosion-proof enclosure 302. In one or more exemplary embodiments, the interior of the explosion-proof enclosure 302 may be divided into two or more regions. In FIG. 3, the interior of the explosion-proof enclosure 302 is divided into a first region 320 and a second region 322. The first region 320 may have an equal or higher temperature than the second region 322 while one or more components within the interior of the explosion-proof enclosure 302 are operating. The air moving device 310 and the air moving device controller 324 shown in FIG. 3 are located in the first region 320. Further, the VFD 304 shown in FIG. 3 is located in the second region 322.

In one or more exemplary embodiments, an air moving device 310 is positioned within the interior of the explosion-proof enclosure 302. The air moving device 310 may be a blower, a fan, or some similar device that is configured to move air. The air moving device 310 may include a motor that is used to control the flow of air (e.g., exhaust air) within the explosion-proof enclosure 302. The air moving device 310 may be configured to move air inside the explosion-proof enclosure 302. Specifically, the air moving device 310 may be configured to draw intake air from outside the explosion-proof enclosure 302, move intake air and/or exhaust air within the explosion-proof enclosure 302, and/or remove exhaust air from the interior of the explosion-proof enclosure 302. The air moving device 310 may drive a differential pressure within the interior of the explosion-proof enclosure 302 to create the air flow.

The air moving device 310 may draw intake air from outside the explosion-proof enclosure 302 through one or more intake apertures in the explosion-proof enclosure 302. In one or more exemplary embodiments, an air intake filter assembly 314 is incorporated into the one or more intake apertures in the explosion-proof enclosure 302. Specifically, the air intake filter assembly 314 may be coupled to an intake aperture in a wall of the explosion-proof enclosure 302. In one or more exemplary embodiments, the intake aperture in the wall of the explosion-proof enclosure 302 is located in, or adjacent to, the second region 322 of the interior of the explosion-proof enclosure 302.

In one or more exemplary embodiments, the air intake filter assembly 314 is configured to remove contaminants from the intake air as the intake air passes from outside the explosion-proof enclosure 302 to the interior of the explosion-proof enclosure 302. The air intake filter assembly 314 may also be configured to cool the intake air as the intake air passes from outside the explosion-proof enclosure 302 to the interior of the explosion-proof enclosure 302. The air intake filter assembly 314 (and its components) may be coupled to the explosion-proof enclosure 302 in such a way, and assembled in such a way, as to meet the standards required for an explosion-proof enclosure. The air intake filter assembly 314 may include a sintered filter.

In one or more exemplary embodiments, the air intake filter assembly 314 includes one or more other components (e.g., a heat exchanger, copper mesh) may be coupled to the air intake filter assembly 314 to help cool the intake air. For example, the air intake filter assembly 314 may include a heat exchanger for cooling the intake air. As another example, the air intake filter assembly 314 may include a thermoelectric cooler for cooling the intake air.

Each air intake filter assembly 314 may be configured in one of a number of different ways. In one or more exemplary embodiments, the air intake filter assembly 314 is configured to include at least one cavity, where a filter (e.g., sintered material) couples to each cavity. In exemplary embodiments where an air intake filter assembly 314 includes multiple cavities, more air flow (i.e., a higher rate of air flowing per unit time) may be possible compared to an air intake filter assembly 314 with only a single cavity. Each filter of the air intake filter assembly 314 may be configured to remove contaminants from the intake air as the intake air passes through the filter to the interior of the explosion-proof enclosure 302. Each filter of the air intake filter assembly 314 may also be configured to cool the intake air as the intake air passes through the filter to the interior of the explosion-proof enclosure 302. Each cavity may be one of a number of shapes, including but not limited to an ellipse, a rectangle, an octagon, a triangle, and a circle.

Once the intake air is within the interior of the explosion-proof enclosure 302, the air moving device 310 is configured to pass the intake air over one or more heat-generating components 390 and/or heat-generating components 391. The heat-generating components 390 are located in the second region 322, and the heat-generating components 391 are located in the first region 320. As discussed above, in the example of FIG. 3, the heat-generating components 390 in the second region 322 can include, but are not limited to, the VFD 304, a control board 306, a switch 308, a measuring device 340, a relay 341, and a wiring terminal 342. In one or more exemplary embodiments, one or more of the heat-generating components 390 are located in the second region 322. For example, the air moving device 310 may pass the intake air over the VFD 304 in the second region 322 of the interior of the explosion-proof enclosure 302. The air moving device 310 may pass the intake air over the heat-generating components 390 using a channel or intake (not shown), separate from the controller intake 318. In such a case, the channel may be positioned in the second region 322 of the interior of the explosion-proof enclosure and configured to direct the intake air toward the heat-generating components 390.

As the air moving device 310 passes the intake air over the one or more heat-generating components 390 in the second region 322 (and, in some cases, the heat-generating components 391 in the first region 320), the intake air cools the heat-generating components 390 (and, in some cases, the heat-generating components 391 in the first region 320). As the heat-generating components 390 are cooled, the temperature of the intake air increases to generate exhaust air. In other words, the temperature of the exhaust air is greater than the temperature of the intake air. In one or more exemplary embodiments, the air moving device 310 is further configured to remove the exhaust air from the interior of the explosion-proof enclosure 302.

In one or more exemplary embodiments, the air moving device 310 operates continuously. Alternatively, the air moving device 310 may operate on a periodic basis. The periodic basis may be random, at a fixed interval, based on some operating parameter (e.g., the temperature inside the explosion-proof enclosure exceeds a threshold temperature), user preferences, some other suitable factor, or any combination thereof. The operation of the air moving device 310 may be controlled by one or more of a number of sources, including but not limited to a user (through manual operation) and an air moving device controller 324.

In one or more exemplary embodiments, the air moving device 310 (with or without the air moving device controller 324, described below) also becomes a heat-generating component 391 in the first region 320. In such a case, intake air (or a portion thereof) may be directed to and passed over the air moving device 310 and/or other heat generating components 391 in the first region 320 to cool the air moving device 310 and/or other heat generating components 391 in the first region 320. The intake air may be directed to and passed over the air moving device 310 and/or other heat generating components 391 in the first region 320 using an airflow within the explosion-proof enclosure created by the air moving device 310. Alternatively, or in addition, the intake air may be directed to and passed over the air moving device 310 and/or other heat generating components 391 in the first region 320 using some other means, including but not limited to a pressure differential and another air moving device.

A controller intake 318 may be used to direct intake air toward the air moving device 310 air moving device controller 324 and/or other heat generating components 391 in the first region 320. The controller intake 318 may take the intake air from any point within or outside the explosion-proof enclosure 302, including but not limited to an aperture in the explosion-proof enclosure 302 and an intake air filter assembly 314 coupled to an aperture in the explosion-proof enclosure 302. The controller intake 318 may be made of any material (e.g., plastic, aluminum, ethylene propylene diene monomer (EPDM) rubber), any configuration, and/or of any size suitable for directing a portion of the intake air toward the air moving device 310.

As the intake air passes over the air moving device 310, the air moving device controller 324 and/or other heat generating components 391 in the first region 320, the intake air cools the air moving device 310, the air moving device controller 324 and/or other heat generating components 391 in the first region 320. As the air moving device 310, the air moving device controller 324 and/or other heat generating components 391 in the first region 320 are cooled, the temperature of the intake air increases to generate additional exhaust air. In other words, the temperature of the additional exhaust air is greater than the temperature of the intake air. In one or more exemplary embodiments, the air moving device 310 is further configured to remove the additional exhaust air from the interior of the explosion-proof enclosure 302.

In one or more exemplary embodiments, a baffle 326 is inserted within the interior of the explosion-proof enclosure 302. The baffle 326 may be configured to separate one region 322 (i.e., the relatively high temperature portion of the interior of the explosion-proof enclosure 302) from another region 320 (i.e., the relatively low temperature portion of the interior of the explosion-proof enclosure 302). The baffle 326 may be made of any material (e.g., metal, plastic) and in any dimensions (e.g., length, width, thickness, shape) suitable to provide a physical barrier between the first region 320 and the second region 322 within the interior of the explosion-proof enclosure 302. The baffle 326 may be positioned within the interior of the explosion-proof enclosure 302 on a side of the air moving device 310 proximate to the second region 322. In this example, the baffle 326 is positioned just below the air moving device 310 and the air moving device controller 324 to separate the first region 320 from the second region 322.

In one or more exemplary embodiments, the air moving device controller 324 is a component located within the interior of the explosion-proof enclosure 302. Specifically, in FIG. 3, the air moving device controller 324 is located in the first region 320. The air moving device controller 324 may be configured to control the operation of the air moving device 310. For example, the air moving device controller 324 may be configured to start the air moving device 310, stop the air moving device 310, and increase and/or decrease the speed at which the air moving device 310 operates.

In one or more exemplary embodiments, the air moving device controller 324 is also coupled to other components.

Such other components may be located within the interior of the explosion-proof enclosure 302 and/or adjacent to the explosion-proof enclosure 302. Such other components may be, or provide information related to, the operation of the air moving device 310. Examples of such other components may include, but are not limited to, a measuring device 340 (e.g., a temperature sensor, an air flow sensor), the control board 306 (described below), and a pushbutton.

For example, the air moving device controller 324 may be coupled to a measuring device 340 configured to measure the temperature (i.e., a temperature sensor) at some point in the interior of the explosion-proof enclosure. When the temperature measured by the measuring device 340 exceeds a first threshold temperature value, the air moving device controller 324 may start the air moving device 310 and regulate the speed of the air moving device 310 until the temperature measured by the measuring device 340 falls below a second threshold value. When the temperature at the point in the interior of the explosion-proof enclosure measured by the measuring device 340 falls below the second threshold temperature, then the air moving device controller 324 may stop the air moving device 310.

As discussed above, the air moving device controller 324 may be a heat-generating component 391 in the first region 320. Other heat-generating components 390 in the second region 322 may include, but are not limited to, a VFD 304, a relay 341, a wiring terminal 342, and a switch 308, all of which are substantially similar to the corresponding components described above with respect to FIG. 2. A heat-generating component 391 in the first region 320 may also include a control board 306. The control board 306 may be configured to interface with the VFD 304. Specifically, the control board 306 may send signals to, and/or receive signals from, the VFD 304. The signals sent between the control board 306 and the VFD 304 may include, but are not limited to, commands, information, requests, instructions, status, and data. The control board 306 may communicate with the VFD 304 through hard-wires and/or a wireless interface.

In one or more exemplary embodiments, the one or more heat-generating components (e.g., heat-generating components 390 in the second region 322, heat-generating components 391 in the first region 320) generates a quantifiable amount of heat energy during operation. For example, a VFD 304 may generate 1200 watts or more of heat energy inside the explosion-proof enclosure 302. As another example, the air moving device controller 324 and/or the air moving device 310 may generate 370 watts or more of heat energy inside the explosion-proof enclosure 302. As yet another example, the switch 308 may generate 27 watts or more of heat energy inside the explosion-proof enclosure 302.

The control board 306 may also be configured to communicate with other components (e.g., switch 308, air moving device controller 324) and/or a user. Communication with a user may be conveyed directly (e.g., an indicating light or display screen mounted on the exterior of the door of the explosion-proof enclosure 302) or indirectly (e.g., sending a signal to a control room where the communication is conveyed).

In one or more exemplary embodiments, the air moving device intake 312 is coupled to the air moving device 310. The air moving device intake 312 may be configured to receive the exhaust air after the exhaust air passes over the heat-generating components 390 in the first region 322. Specifically, the air moving device intake 312 may be configured to draw the exhaust air from the first region 322 after the exhaust air passes over the heat-generating components 390 (e.g., the VFD 304) toward an aperture of the explosion-proof enclosure 302. The air moving device intake 312 may include a screen, filter, and/or other similar feature to remove contaminants from the exhaust air and/or to lower the temperature of the exhaust air.

In one or more exemplary embodiments, the manifold 330 is coupled to the air moving device 310 and/or the air moving device intake 312. The manifold 330 may be configured to direct some or all of the exhaust air and the additional exhaust air (if any) outside the explosion-proof enclosure 302. The manifold 330 may form a seal between the air moving device 310 (and/or the air moving device intake 312) and the exhaust air filter assembly 316, described below. By forming a seal, the manifold 330 may create and/or maintain a differential pressure to create air flow to remove the exhaust air and/or the additional exhaust air from the explosion-proof enclosure 302.

The air moving device 310 may remove the some or all of the exhaust air and the additional exhaust air from the interior of the explosion-proof enclosure 302 through one or more outlet apertures (different from the intake apertures described above with respect to the intake air) in the explosion-proof enclosure 302. In one or more exemplary embodiments, an exhaust air filter assembly 316 is incorporated into the one or more outlet apertures in the explosion-proof enclosure 302. Specifically, the exhaust air filter assembly 316 may be coupled to an outlet aperture in a wall of the explosion-proof enclosure 302. In one or more exemplary embodiments, the outlet aperture in the wall of the explosion-proof enclosure 302 is located in, or adjacent to, the first region 320 of the interior of the explosion-proof enclosure 302. The outlet apertures and intake apertures may be one opposite walls of the explosion-proof enclosure 302.

In one or more exemplary embodiments, the exhaust air filter assembly 316 is substantially similar to the air intake filter assembly 314. Thus, the description above with respect to the air intake filter assembly 314 may also apply to the exhaust air filter assembly 316. For example, the exhaust air filter assembly 316 may be configured to allow exhaust air to pass from the interior of the explosion-proof enclosure to outside the explosion-proof enclosure. The exhaust air may have a higher temperature than the temperature of the intake air. The exhaust air filter assembly 316 may further be configured to meet and maintain the standards and requirements for an explosion-proof enclosure. For example, the exhaust air filter assembly 316 may include a sintered filter.

Figure 4:
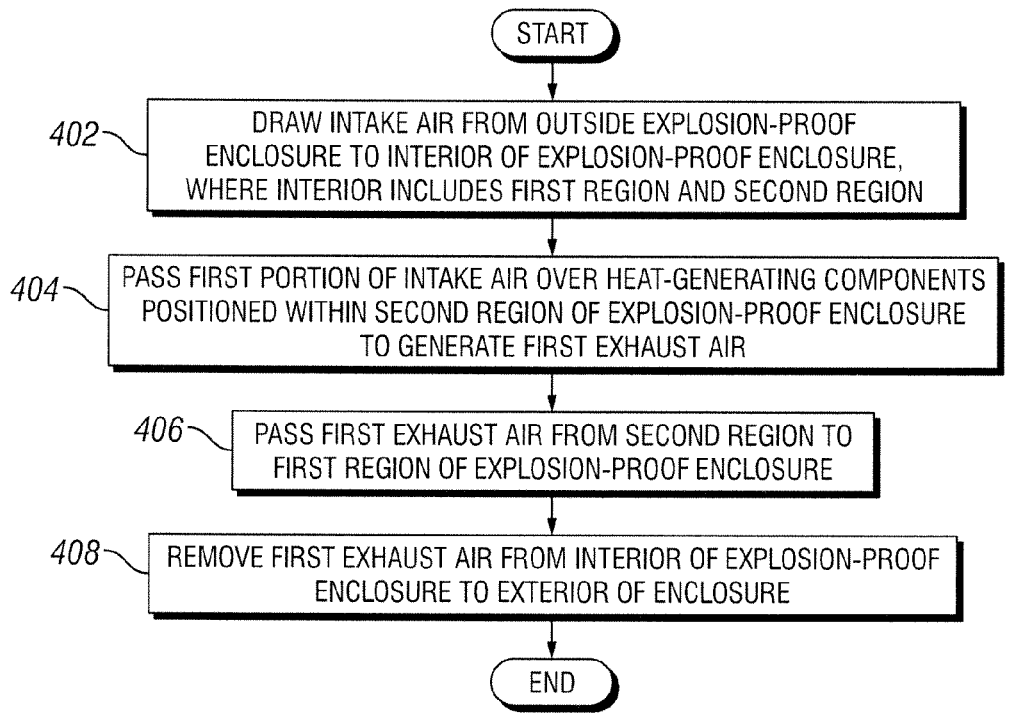
FIG. 4 shows a flowchart of a method for controlling airflow within an explosion-proof enclosure in accordance with one or more exemplary embodiments.

FIG. 4 shows a flowchart of a method for controlling airflow inside an explosion-proof enclosure in accordance with one or more exemplary embodiments. While the various steps in this flowchart are presented and described sequentially, one of ordinary skill will appreciate that some or all of the steps may be executed in different orders, may be combined or omitted, and some or all of the steps may be executed in parallel. Further, in one or more of the exemplary embodiments of the invention, one or more of the steps described below may be omitted, repeated, and/or performed in a different order. In addition, a person of ordinary skill in the art will appreciate that additional steps, omitted in FIG. 4, may be included in performing this method. Accordingly, the specific arrangement of steps shown in FIG. 4 should not be construed as limiting the scope of the invention.

In Step 402, intake air is drawn from outside an explosion-proof enclosure to the interior of the explosion-proof enclosure. The interior of the explosion-proof enclosure may include a first region and a second region. The intake air may be drawn to the interior of the explosion-proof enclosure based on input (e.g., a measurement) received from a measuring device. The intake air may be drawn to the interior of the explosion-proof enclosure using one or more of a number of methods, including pressure differential, induction, and creating air flow with an air moving device (e.g., a fan, a blower). For example, an air moving device, located in either the first region or the second region, may be used to draw the intake air from outside the explosion-proof enclosure to the interior of the explosion-proof enclosure.

The intake air may be drawn from outside the explosion-proof enclosure to the interior of the explosion-proof enclosure based on input received from one or more measuring devices. A measuring device may measure one or more parameters (e.g., temperature, air flow) on the interior of the explosion-proof enclosure. In one or more exemplary embodiments, the intake air may be drawn to the interior of the explosion-proof enclosure through at least one intake air filter assembly. In such a case, the intake air filter assembly may be used cool the intake air and/or remove contaminants from the intake air before the intake air is drawn to the interior of the explosion-proof enclosure.

In Step 404, a first portion of the intake air is passed over heat-generating components. The intake air may be divided into any number of portions. In one or more exemplary embodiments, the heat-generating components are located in the second region of the explosion-proof enclosure. First exhaust air may be generated when the first portion of the intake air cools the heat-generating components, which in turn heats the first portion of the intake air. In other words, the temperature of the first exhaust air is greater than the temperature of the intake air.

Optionally, a second portion of the intake air may be passed over an air moving device and/or an air moving device controller. In one or more exemplary embodiments, the air moving device and/or the air moving device controller may be located in the first region of the explosion-proof enclosure. In such a case, second exhaust air may be generated when the second portion of the intake air cools the air moving device and/or the air moving device controller, which in turn heats the second portion of the intake air. In other words, the temperature of the second exhaust air is greater than the temperature of the intake air.

In Step 406, the first exhaust air is passed from the second region to the first region of the explosion-proof enclosure. The first exhaust air may be drawn using the same or a different method than the method used to draw the first portion of the intake air to the interior of the explosion-proof enclosure. For example, the air moving device described above with respect to Step 404 may be used to pass the first exhaust air from the second region to the first region of the explosion-proof enclosure.

In Step 408, the first exhaust air is removed from the interior of the explosion-proof enclosure to the outside of the explosion-proof enclosure. The first exhaust air may be removed from the interior of the explosion-proof enclosure using the same or a different method than the method used to draw the first portion of the intake air to the interior of the explosion-proof enclosure. For example, the air moving device described above with respect to Step 404 may be used to remove the first exhaust air from the interior of the explosion-proof enclosure to the outside of the explosion-proof enclosure.

Optionally, in the case where second exhaust air has been generated as described above with respect to Step 404, the second exhaust air may also be removed from the interior of the explosion-proof enclosure to the outside of the explosion-proof enclosure. The second exhaust air may be removed from the interior of the explosion-proof enclosure using the same or a different method than the method used to remove the exhaust air from the interior of the explosion-proof enclosure. For example, the air moving device described above with respect to Step 404 may be used to remove the second exhaust air from the interior of the explosion-proof enclosure to the outside of the explosion-proof enclosure.

Figure 5:
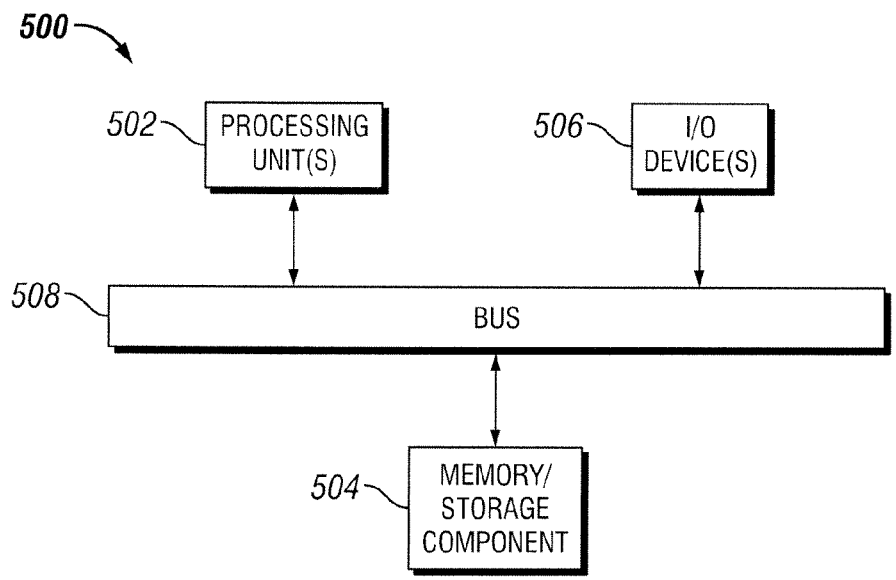
FIG. 5 shows a computing device in accordance with one or more exemplary embodiments.

FIG. 5 illustrates one embodiment of a computing device 500 that can implement one or more of the various techniques described herein, and which may be representative, in whole or in part, of the elements described herein. Computing device 500 is only one example of a computing device and is not intended to suggest any limitation as to scope of use or functionality of the computing device and/or its possible architectures. Neither should computing device 500 be interpreted as having any dependency or requirement relating to any one or combination of components illustrated in the example computing device 500.

Computing device 500 includes one or more processors or processing units 502, one or more memory/storage components 504, one or more input/output (I/O) devices 506, and a bus 508 that allows the various components and devices to communicate with one another. Bus 508 represents one or more of any of several types of bus structures, including a memory bus or memory controller, a peripheral bus, an accelerated graphics port, and a processor or local bus using any of a variety of bus architectures. Bus 508 can include wired and/or wireless buses.

Memory/storage component 504 represents one or more computer storage media. Memory/storage component 504 may include volatile media (such as random access memory (RAM)) and/or nonvolatile media (such as read only memory (ROM), flash memory, optical disks, magnetic disks, and so forth). Memory/storage component 504 can include fixed media (e.g., RAM, ROM, a fixed hard drive, etc.) as well as removable media (e.g., a Flash memory drive, a removable hard drive, an optical disk, and so forth).

One or more I/O devices 506 allow a customer, utility, or other user to enter commands and information to computing device 500, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media may be any available non-transitory medium or non-transitory media that can be accessed by a computing device. By way of example, and not limitation, computer readable media may comprise "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device 500 may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system 500 includes at least the minimal processing, input, and/or output means necessary to practice one or more embodiments.

Further, those skilled in the art will appreciate that one or more elements of the aforementioned computer device 500 may be located at a remote location and connected to the other elements over a network. Further, one or more embodiments may be implemented on a distributed system having a plurality of nodes, where each portion of the implementation (e.g., controller 115, energy source 120) may be located on a different node within the distributed system. In one or more embodiments, the node corresponds to a computer system. Alternatively, the node may correspond to a processor with associated physical memory. The node may alternatively correspond to a processor with shared memory and/or resources.

The following description (in conjunction with FIGS. 1 through 5) describes a few examples in accordance with one or more exemplary embodiments. The examples are for controlling airflow inside an explosion-proof enclosure. Terminology used in FIGS. 1 through 5 may be used in the example without further reference to FIGS. 1 through 5.

EXAMPLE

Consider the following example, shown in FIGS. 6A through 6D, which describes controlling airflow inside an explosion-proof enclosure in accordance with one or more exemplary embodiments described above. In this example, the explosion-proof enclosure is substantially similar to the explosion-proof enclosure described above with respect to FIG. 3. Further, the measuring device of FIG. 3 measures the temperature of the VFD inside the explosion-proof enclosure.

Figure 6A:
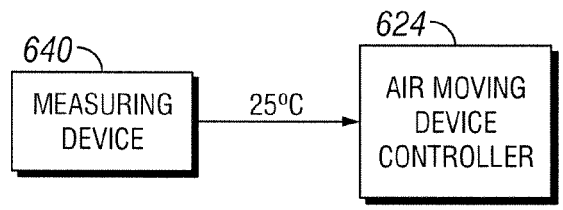
FIGS. 6A through 6D show an example in accordance with one or more exemplary embodiments.

FIG. 6A shows that the measuring device 640 measures the temperature of the VFD as 25° C. A signal is sent from the measuring device 640 to the air moving device controller 624 notifying the air moving device controller 624 that the temperature of the VFD is 25° C. In this example, the air moving device controller 624 is configured to control airflow inside the explosion-proof enclosure when the temperature of the VFD is 55° C. or higher. The air moving device controller 624 is further configured to reduce, once the air moving device is in operation, the rate at which the air moving device operates as the temperature of the VFD falls to 47° C. or lower. Finally, the air moving device controller 624 is further configured to stop the air moving device when the temperature of the VFD falls below 40° C. Because the temperature of the VFD is 25° C., the air moving device controller 624 does not start the air moving device (not shown in FIG. 6A).

Figure 6B:
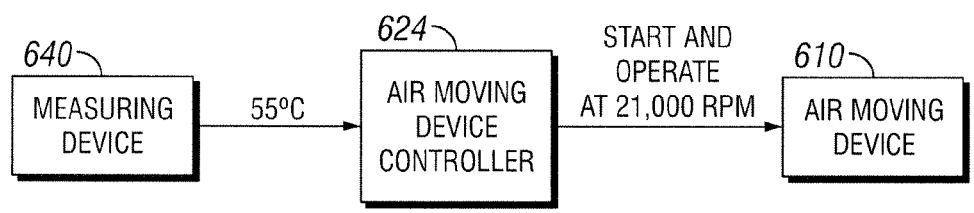

At some point later in time, FIG. 6B shows that the measuring device 640 measures the temperature of the VFD as 55° C. A signal is sent from the measuring device 640 to the air moving device controller 624 notifying the air moving device controller 624 that the temperature of the VFD is 55° C. Because the temperature is at the threshold temperature of 55° C., the air moving device controller 624 sends a signal to the air moving device 610. Specifically, the air moving device controller 624 instructs the air moving device 610 to start and to operate at 21,000 rotations per minute (rpm).

Figure 6C:
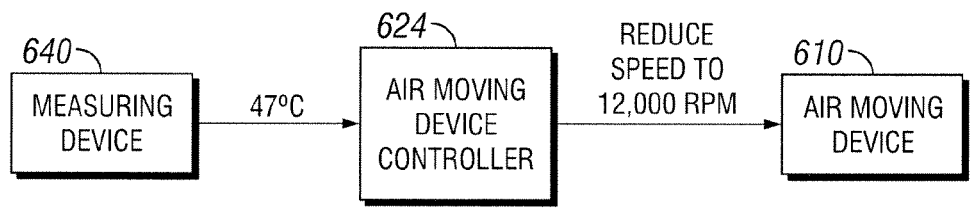

Subsequently, as shown in FIG. 6C, as the air moving device 610 continues to operate and the resulting airflow through the explosion-proof enclosure lowers the temperature of the VFD, the measuring device 640 measures the temperature of the VFD as 47° C. A signal is sent from the measuring device 640 to the air moving device controller 624 notifying the air moving device controller 624 that the temperature of the VFD is 47° C. Because the temperature of the VFD is 47° C., the air moving device controller 624 reduces the rate at which the air moving device 610 operates from 21,000 rpm to 12,000 rpm.

Figure 6D:
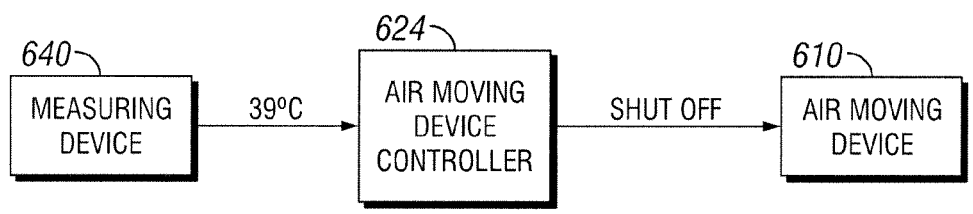

Subsequently, as shown in FIG. 6D, as the air moving device 610 continues to operate and the resulting airflow through the explosion-proof enclosure continues to lower the temperature of the VFD, the measuring device 640 measures the temperature of the VFD as 39° C. A signal is sent from the measuring device 640 to the air moving device controller 624 notifying the air moving device controller 624 that the temperature of the VFD is 39° C. Because the temperature of the VFD is below 40° C., the air moving device controller 624 stops the air moving device 610.

One or more exemplary embodiments provide for controlling airflow inside an explosion-proof enclosure. Specifically, one or more exemplary embodiments are configured to use one or more air moving devices within the interior of the explosion-proof enclosure. In such a case, the air moving device may control the amount of air flowing through the explosion-proof enclosure to lower the temperature inside the explosion-proof enclosure. The temperature on the interior of the explosion-proof enclosure may increase to levels that may be detrimental to the operation of one or more components and/or devices located inside the explosion-proof enclosure. The increase in temperature on the interior of the explosion-proof enclosure may be caused by one or more heat-generating components.

Exemplary embodiments described herein may control the airflow inside the explosion-proof enclosure to maintain an acceptable temperature that assures continued operation of the components and/or devices located inside the explosion-proof enclosure while also maintaining the standards and/or requirements for an explosion-proof enclosure. As a result, use of exemplary embodiments described herein may allow for the inclusion of one or more heat-generating components within the interior of the explosion-proof enclosure without affecting the operation of the devices and/or components located inside, or associated with, the explosion-proof enclosure. Consequently, exemplary embodiments described herein may lower equipment and maintenance costs, allow for easier maintenance, and increase reliability.

Using one or more exemplary embodiments, the intake air passes through one or more air intake filter assemblies (i.e., when the intake air is drawn from outside the explosion-proof enclosure) at a rate of at least 175 cubic feet per minute (cfm) when the explosion-proof enclosure is size 2 and when the heat-generating component generates heat in the second region of the explosion-proof enclosure at 50° C. In so doing, the temperature inside the explosion-proof enclosure is sufficiently maintained by controlling the airflow through the explosion-proof enclosure using one or more exemplary embodiments. The rate may also be lower or higher than 175 cfm, depending on one or more of a number of factors, including but not limited to the cooling requirements of the VFD.

Using one or more exemplary embodiments, the intake air passes through one or more air intake filter assemblies (i.e., when the intake air is drawn from outside the explosion-proof enclosure) at a rate of at least 75 cfm when the explosion-proof enclosure is size 1 and when the heat-generating component generates heat in the second region of the explosion-proof enclosure at 50° C. In so doing, the temperature inside the explosion-proof enclosure is sufficiently maintained by controlling the airflow through the explosion-proof enclosure using one or more exemplary embodiments. The rate may also be lower or higher than 75 cfm, depending on one or more of a number of factors, including but not limited to the cooling requirements of the VFD.

Although controlling airflow inside an explosion-proof enclosure is described with reference to preferred embodiments, it should be appreciated by those skilled in the art that various modifications are well within the scope of controlling airflow inside an explosion-proof enclosure. From the foregoing, it will be appreciated that an embodiment of controlling airflow inside an explosion-proof enclosure overcomes the limitations of the prior art. Those skilled in the art will appreciate that controlling airflow inside an explosion-proof enclosure is not limited to any specifically discussed application and that the exemplary embodiments described herein are illustrative and not restrictive. From the description of the exemplary embodiments, equivalents of the elements shown therein will suggest themselves to those skilled in the art, and ways of constructing other embodiments of controlling airflow inside an explosion-proof enclosure will suggest themselves to practitioners of the art. Therefore, the scope of controlling airflow inside an explosion-proof enclosure is not limited herein.

What is claimed is:

1. A system comprising:
an explosion-proof enclosure comprising an enclosure body and an enclosure cover coupled to the enclosure body, wherein the enclosure cover and the enclosure body, when coupled to each other, form an enclosed interior;
a baffle disposed within the enclosed interior of the explosion-proof enclosure, wherein the baffle divides the enclosed interior into a first region and a second region;
a first heat-generating component positioned, at least in part, within the second region of the explosion-proof enclosure; and
an air moving device positioned within the first region of the explosion-proof enclosure and configured to:
draw a first portion of intake air from outside the explosion-proof enclosure;
pass the first portion of the intake air over the first heat-generating component in the enclosed interior of the explosion-proof enclosure to generate first exhaust air, wherein the first portion of the intake air cools the first heat-generating component; and
remove the first exhaust air from the enclosed interior of the explosion-proof enclosure,
wherein the explosion-proof enclosure, with the baffle, the first heat-generating component, and the air moving device disposed in the enclosed interior,
wherein the enclosure body and the enclosure cover of the explosion proof enclosure,
when coupled to each other, contain an explosion that originates from the enclosed interior, and
wherein the enclosure body and the enclosure cover of the explosion proof enclosure,
when coupled to each other, allow explosion gases inside the enclosed interior to escape across at least one joint and cool as the gases exit the enclosed interior.

2. The system of claim 1, further comprising:
an air moving device intake coupled to the air moving device and configured to receive the first exhaust air from the first heat-generating component;
at least one air intake filter assembly configured to remove contaminants from the intake air as the intake air passes from outside the explosion-proof enclosure to the enclosed interior of the explosion-proof enclosure, wherein the air intake filter assembly is coupled to a first wall of the explosion-proof enclosure in the second region of the explosion-proof enclosure; and
at least one exhaust air filter assembly configured to pass the first exhaust air from the air moving device intake to outside the explosion-proof enclosure, wherein the exhaust air filter assembly is coupled to a second wall of the explosion-proof enclosure in the first region of the explosion-proof enclosure,
wherein the first exhaust air has a first temperature greater than a second temperature of the intake air.

3. The system of claim 2, further comprising:
a controller intake configured to direct a second portion of the intake air from the at least one air intake filter assembly to the air moving device to generate second exhaust air, wherein the second portion of the intake air cools the air moving device,
wherein the at least one exhaust air filter assembly is further configured to pass the second exhaust air from the air moving device to outside the explosion-proof enclosure,
wherein the second exhaust air has a third temperature greater than the second temperature of the intake air.

4. The system of claim 3, wherein the baffle is positioned on a side of the air moving device proximate to the second region.

5. The system of claim 2, wherein the air intake filter assembly comprises a heat exchanger for cooling the intake air.

6. The system of claim 2, wherein the air intake filter assembly comprises a thermoelectric cooler for cooling the intake air.

7. The system of claim 2, wherein the intake air passes through the at least one air intake filter assembly at a rate of at least 75 cubic feet per minute when the first heat-generating component generates heat in the second region of the explosion-proof enclosure at 50° C.

8. The system of claim 7, wherein the intake air passes through the at least one air intake filter assembly at a rate of at least 175 cubic feet per minute when the first heat-generating component generates heat in the second region of the explosion-proof enclosure at 50° C.

9. The system of claim 2, wherein the at least one exhaust air filter assembly comprises a sintered filter.

10. The system of claim 2, wherein the at least one air intake filter assembly comprises a plurality of cavities, wherein each cavity of the plurality of cavities has coupled thereto sintered material, wherein the sintered material is configured to remove contaminants from the intake air as the intake air passes through the sintered material to the enclosed interior of the explosion-proof enclosure.

11. The system of claim 10, wherein the plurality of cavities comprises an elliptical shape.

12. The system of claim 10, wherein the plurality of cavities comprises a rectangular shape.

13. The system of claim 2, wherein the at least one air intake filter assembly and the first wall of the explosion-proof enclosure form a flame path therebetween.

14. The system of claim 1, wherein the first heat-generating component comprises a variable frequency drive.

15. The system of claim 1, wherein the air moving device is a blower and comprises a second heat-generating component.

16. The system of claim 1, further comprising:
at least one channel positioned in the second region of the enclosed interior of the explosion-proof enclosure and configured to direct the intake air toward the first heat-generating component.

17. The system of claim 1, further comprising:
a manifold coupled to the air moving device and configured to direct the first exhaust air outside the explosion-proof enclosure.

18. A system comprising:
a baffle configured to be disposed within an enclosed interior of an explosion-proof enclosure, wherein the enclosed interior is defined by an enclosure cover coupled to an enclosure body, wherein the baffle divides the enclosed interior into a first region from a second region;
a first heat-generating component configured to be positioned, at least in part, within the second region of the enclosed interior of the explosion-proof enclosure; and
an air moving device configured to be positioned within the first region of the enclosed interior of the explosion-proof enclosure, wherein the air moving device is further configured to:
draw a first portion of intake air from outside the explosion-proof enclosure;
pass the first portion of the intake air over the first heat-generating component in the enclosed interior of the explosion-proof enclosure to generate first exhaust air, wherein the first portion of the intake air cools the first heat-generating component; and
remove the first exhaust air from the enclosed interior of the explosion-proof enclosure,
wherein the explosion-proof enclosure, with the baffle, the first heat-generating component, and the air moving device disposed in the enclosed interior,
wherein the enclosure body and the enclosure cover of the explosion proof enclosure,
when coupled to each other, contain an explosion that originates from the enclosed interior, and
wherein the enclosure body and the enclosure cover of the explosion proof enclosure,
when coupled to each other, allow explosion gases inside the enclosed interior to escape across at least one joint and cool as the gases exit the enclosed interior.

19. The system of claim 18, wherein the air moving device comprises a second heat-generating component.

* * * * *